United States Patent
Tsukashima (10) Patent No.: US 8,421,537 B2
(45) Date of Patent: Apr. 16, 2013

(54) ELECTRONIC CIRCUIT

(75) Inventor: Koji Tsukashima, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/305,186

(22) Filed: Nov. 28, 2011

(65) Prior Publication Data

US 2012/0133441 A1    May 31, 2012

(30) Foreign Application Priority Data

Nov. 29, 2010   (JP) ................. 2010-265785

(51) Int. Cl.
*H03F 3/60*   (2006.01)

(52) U.S. Cl.
USPC ............................. 330/286; 330/310

(58) Field of Classification Search .......... 330/310, 330/98, 133, 150, 286
See application file for complete search history.

(56) References Cited

U.S. PATENT DOCUMENTS 6,020,848 A * 2/2000 Wallace et al. ............... 342/362
7,459,970 B2 * 12/2008 Yang ............................. 330/51

OTHER PUBLICATIONS

Y. Mimino et al., "High Gain-Density K-Band P-HEMT LNA MMIC for LMDS and Satellite Communication", 2000 IEEE MTT-S Dig., vol. 1, pp. 17-20.
T. Tokumitsu et al., "K-Band 3-D MMIC Low Noise Amplifier and Mixer Using TFMS Lines with Ground Slit", IEEE Microwave and Wireless Components Letters, vol. 15, No. 5, 2005, pp. 318-320.

* cited by examiner

*Primary Examiner* — Hieu Nguyen
(74) *Attorney, Agent, or Firm* — Westerman, Hattori, Daniels & Adrian, LLP (57) ABSTRACT

An electronic circuit includes: a first transistor having a control terminal, a first terminal, and a second terminal; a second transistor having a control terminal connected to the second terminal of the first transistor, a first terminal, and a second terminal connected to a DC power supply; a plurality of DC paths that are mutually independent of each other and supply DC currents from the first terminal of the second transistor to the second terminal of the first transistor; and distributed constant lines connected in series with the plurality of DC paths.

10 Claims, 6 Drawing Sheets

ELECTRONIC CIRCUIT

CROSS-REFERENCE TO RELATED APPLICATION

This application is based upon and claims the benefit of priority of the prior Japanese Patent Application No. 2010-265785, filed on Nov. 29, 2010, the entire contents of which are incorporated herein by reference.

BACKGROUND (i) Technical Field

A certain aspect of the embodiments discussed herein is related to an electronic circuit. Another aspect of the embodiments disclosed herein is related to a current reuse amplifier circuit.

(ii) Related Art

As an amplifier circuit having a plurality of stages, there is known a current reuse circuit in which DC current of a next stage is used in a previous stage (see 2000 IEEE MTT-S Dig., Vol. 1, pp. 17-20; hereinafter referred to as Document 1). In order to realize a broader band in the millimeter wave band or the like, a current reuse amplifier circuit with a stub and a capacitor is used (see IEEE MICROWAVE AND WIRELESS COMPONENTS LETTERS VOL. 15, NO. 5, 2005: hereinafter referred to as Document 2).

The amplifier circuit described in Document 2 may realize a broader band than the amplifier circuit described in Document 1. However, at high frequencies such as millimeter waves, a distributed constant line is short, and an error in the length of the distributed constant line or a difference among distributed constant lines introduced during the manufacturing process may occur.

SUMMARY

According to an aspect of the present invention, there is provided an electronic circuit including: a first transistor having a control terminal, a first terminal, and a second terminal; a second transistor having a control terminal connected to the second terminal of the first transistor, a first terminal, and a second terminal connected to a DC power supply; a plurality of DC paths that are mutually independent of each other and supply DC currents from the first terminal of the second transistor to the second terminal of the first transistor; and distributed constant lines connected in series with the plurality of DC paths.

DETAILED DESCRIPTION

Figure 1:
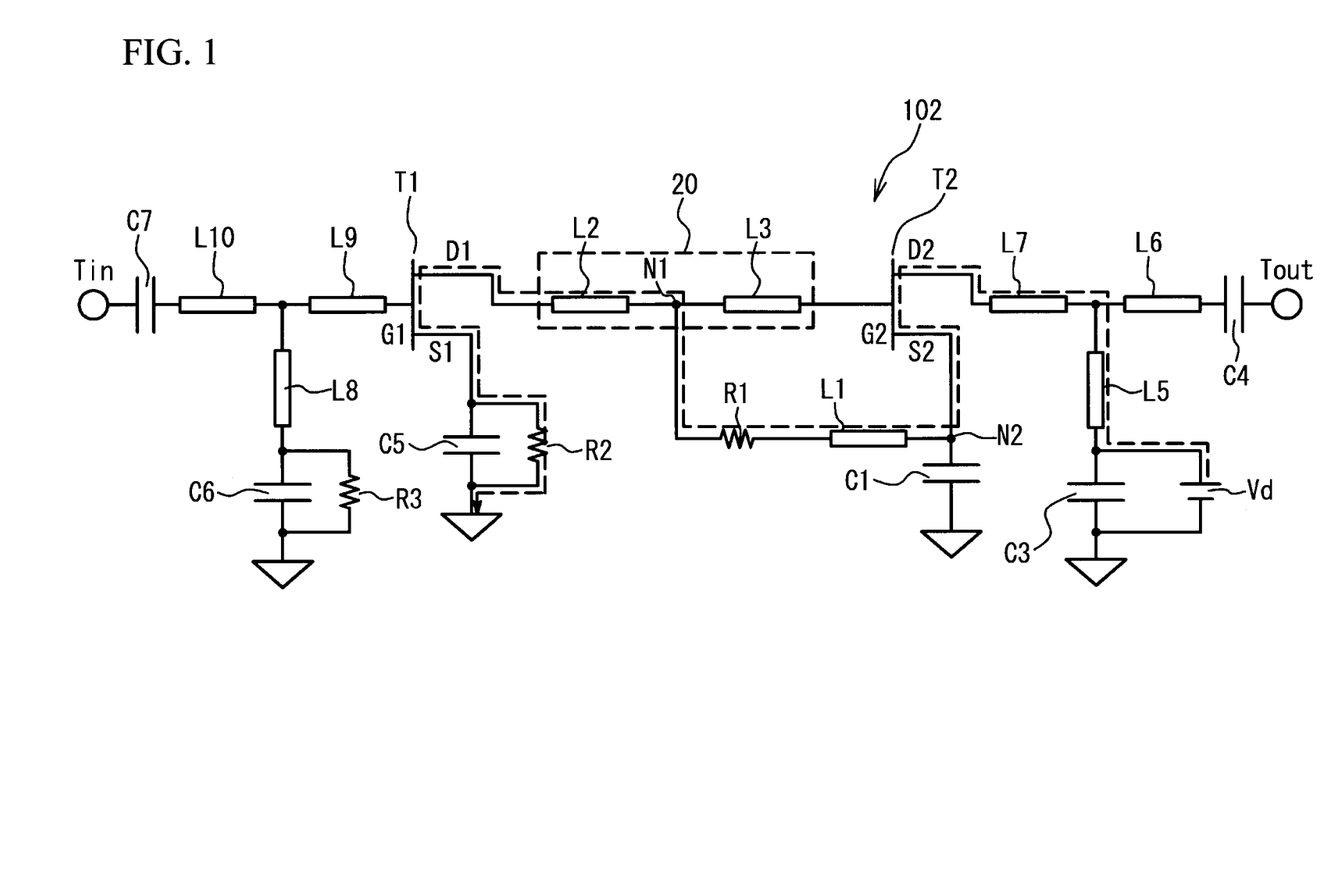
FIG. 1 is a circuit diagram of an amplifier circuit in accordance with a comparative example.

Now, a description is given of a current reuse circuit in accordance with a comparative example with reference to FIG. 1. An amplifier circuit 102 is a two-stage amplifier circuit having a first transistor T1 and a second transistor T2. The following is an exemplary case where the first and second transistors T1 and T2 are FETs (Field Effect Transistors).

A capacitor C7 and distributed constant lines L10 and L9 are connected in series between an input terminal Tin of the amplifier circuit 102 and the gate G1 (control terminal) of the first transistor T1. A node between the distributed constant lines L10 and L9 is grounded via a distributed constant line L8 and a capacitor C6. A resistor R3 is connected in parallel with the capacitor C6. A capacitor C7 is a DC cut capacitor. The distributed constant lines L8, L9 and L10 and the capacitor C6 match the impedance of the input terminal Tin and the input impedance of the first transistor T1 with each other. The resistor R3 defines the potential of the gate G1.

The source S1 (first terminal) of the first transistor T1 is grounded via a capacitor C5 and a resistor R2, which are connected in parallel with each other. The capacitor C5 is grounded in high-frequency operation. The resistor R2 directly grounds the source S1 in DC operation. Further, the resistor R2 defines the potential of the source S1. With the above configurations, the source S1 is grounded in both the DC and high-frequency operations. The drain D1 (second terminal) of the first transistor T1 is connected to the gate G2 (control terminal) of the second transistor T2 via a signal path 20. The signal path 20 includes distributed constant lines L2 and L3 connected in series.

The source S2 (first terminal) of the second transistor T2 is grounded via a capacitor C1 (first capacitor). A node N1 between the distributed constant lines L2 and L3 is connected to a node N2 between the source S2 of the second transistor T2 and the capacitor C1 via the resistor R1 and the distributed constant line L1 connected in series. The distributed constant lines L1, L2 and L3 match the impedances of the first and second transistors T1 and T2 with each other. The resistor R1 develops the potential difference between the source S2 and the gate G2, and defines the potential of the gate G2. Further, the resistor R1 functions to ohmically match the impedances of the first and second transistors T1 and T2 with each other.

Distributed constant lines L7 and L6 and the capacitor C4 are connected in series between drain D2 (second terminal) of the second transistor T2 and an output terminal Tout. A node between the distributed constant lines L7 and L6 is grounded via a distributed constant line L5 and a capacitor C3. A DC power supply Vd is connected in parallel with the capacitor C3. Thus, the DC power supply Vd is connected to the drain D2 to which a DC voltage is applied. The distributed constant lines L5, L6 and L7 and the capacitor C3 match the output impedance of the second transistor T2 and the impedance of the output terminal Tout with each other. The capacitors C3 and C4 are DC cut capacitors.

A signal (high-frequency signal) input via the input terminal Tin is applied to the gate G1 of the first transistor T1. The first transistor T1 amplifies the signal applied to the gate G1 and outputs an amplified signal via the drain D1. The amplified signal passes through the signal path 20 and is applied to the gate G2 of the second transistor T2. The second transistor T2 amplifies the signal applied to the gate G2, and outputs an amplified signal via the drain D2. The amplified signal is output via the output terminal Tout.

Due to the capacitor C1, the source S2 of the second transistor T2 is not grounded in DC operation. Thus, DC current supplied from the DC power supply Vd flows to the ground via the distributed constant lines L5 and L7, the second transistor T2, the node N2, the distributed constant line L1, the resistor R1, the node N1, the distributed constant line L2, the first transistor T1 and the resistor R2, as indicated by a broken line in FIG. 1. A path through which the above DC current is defined as the DC path. The voltage of the DC power supply Vd is applied to the first transistor T1 and the second transistor T2 in series, and the DC current supplied from the DC supply Vd flows through the first transistor T1 and the second transistor T2. It is thus possible to suppress consumed current, as compared with an amplifier circuit configured to have current flow through each transistor independently. The resistor R1 functions to define the potential difference between the source S2 and the gate G2 of the second transistor T2.

However, in a case where the frequency of the signal to be amplified becomes higher, for example, a case where the signal to be amplified is in the millimeter band, the distributed constant line used for the DC path is shorter. Like the comparative example, when the amplifier circuit has a single DC path, the distributed constant line is short. Such a short distributed constant line tends to have an error in the length of the distributed constant line or a difference among distributed constant lines introduced during the manufacturing process. Therefore, distributed constant lines may have different lengths and different characteristics. Embodiments described below are configured taking the above into consideration.

First Embodiment

Figure 2:
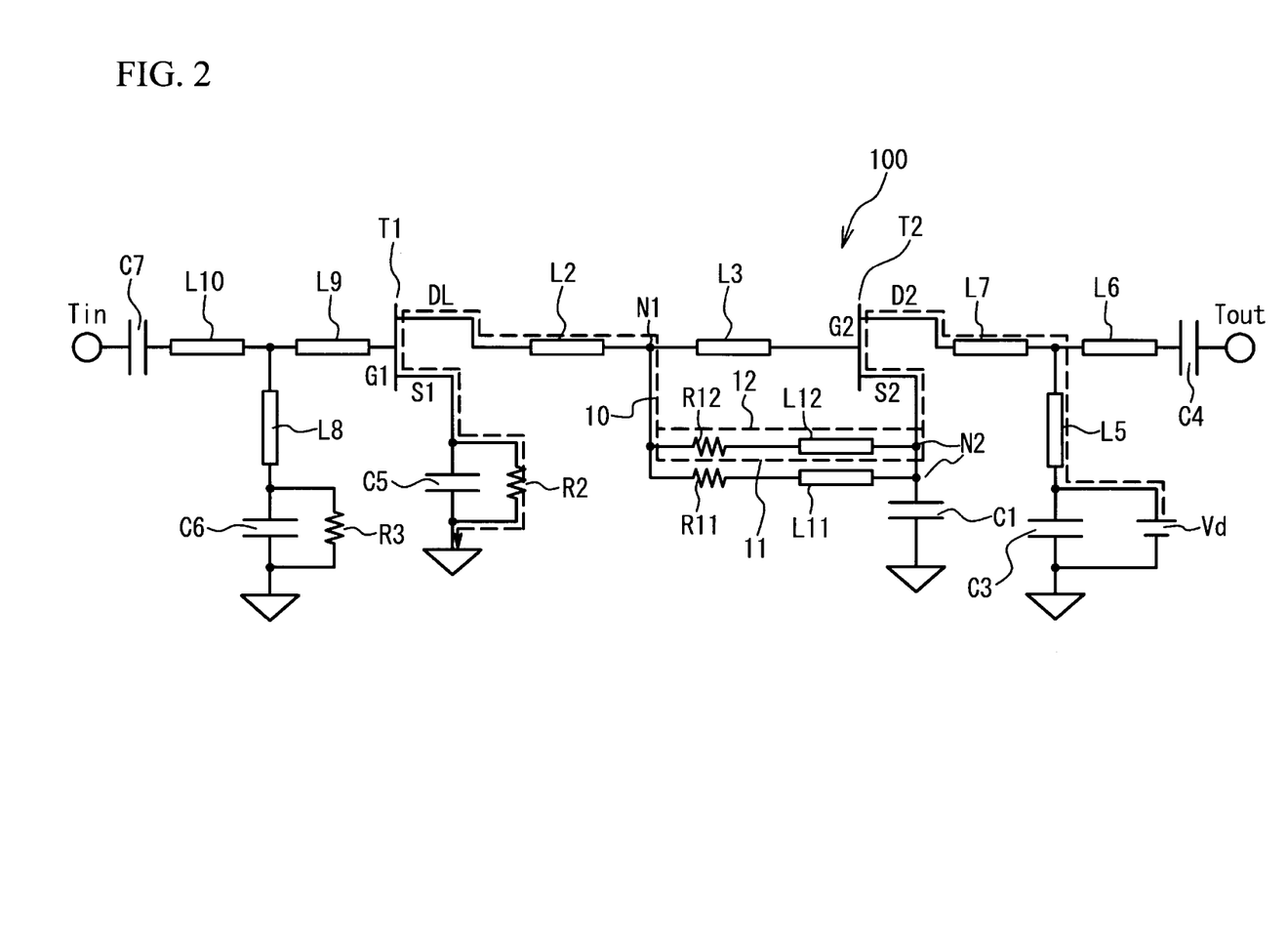
FIG. 2 is a circuit diagram of an amplifier circuit in accordance with a first embodiment.

FIG. 2 is a circuit diagram of an amplifier circuit in accordance with a first embodiment. Referring to FIG. 2, an amplifier circuit 100 is configured to have a DC path that is divided into two DC paths 11 and 12 connected in parallel between the nodes N1 and N2. In the DC path 11, there are provided a distributed constant line L11 and a resistor R11 connected in series. In the DC path 12, there are provided a distributed constant line L12 and a resistor R12 connected in series. The remaining structures of the first embodiment are similar to those of the comparative example.

The DC paths 11 and 12 through which the DC current is supplied from the source S2 of the second transistor T2 to the drain D1 of the first transistor are independent or separate lines. It is thus possible to increase the inductances of the distributed constant lines L11 and L12 respectively provided in the DC paths 11 and 12. It is thus possible to set the lengths of the distributed constant lines L11 and L12 longer than the length of the distributed constant line L1 used in the comparative example. It is thus possible to reduce the dispersion of the characteristics resulting from an error in the length of the distributed constant line or a difference among distributed constant lines introduced during the manufacturing process. The separate DC paths are not limited to two, but three separate DC paths or more may be used.

The DC paths 11 and 12 include the resistors R11 and R12 (first resistors) connected in series with the distributed constant lines L11 and L12, respectively. The resistors R11 and R12 define the gate potential of the second transistor T2. According to the first embodiment, a plurality of DC paths are provided so that each of the DC paths can have a larger inductance than that of the single DC path and a longer length. It is thus possible to reduce the dispersion of the characteristics resulting from an error in the length of the distributed constant line or a difference among distributed constant lines introduced during the manufacturing process.

Second Embodiment

Figure 3:
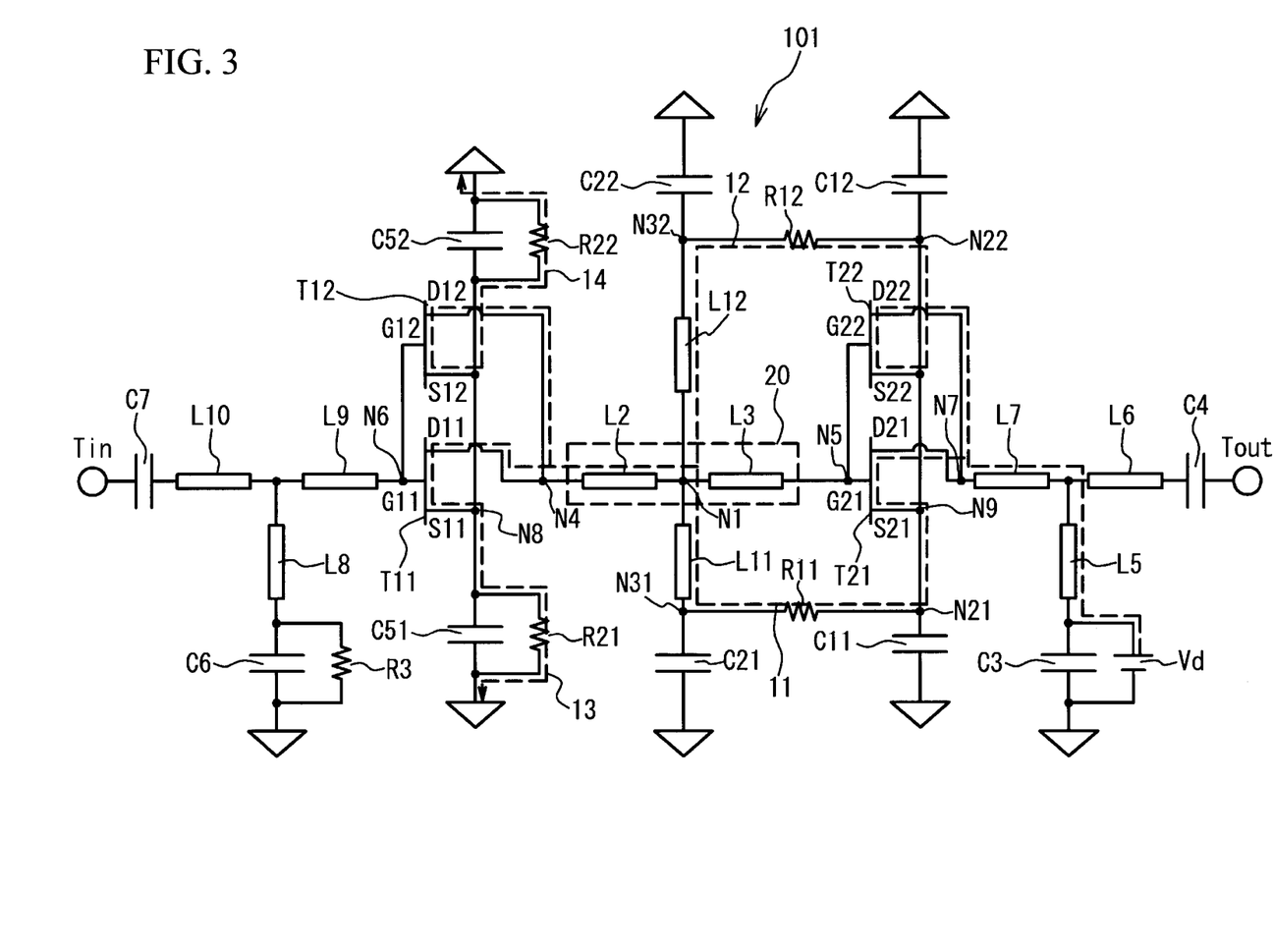
FIG. 3 is a circuit diagram of an amplifier circuit in accordance with a second embodiment.

A second embodiment is configured to have a plurality of first transistors T1 and a plurality of second transistors T2. FIG. 3 is a circuit diagram of an amplifier circuit of the second embodiment. Referring to FIG. 3, an amplifier circuit 101 is configured to have a plurality of first transistors T11 and T12 connected in parallel and a plurality of second transistors T21 and T22 connected in parallel. The sources S11 and S12 of the first transistors T11 and T12 are connected together at a node N8. The source S11 of the first transistor T11 is grounded via a capacitor C51 and a resistor R21, and the source S12 of the first transistor T12 is grounded via a capacitor C52 and a resistor R22.

The gates G11 and G12 of the first transistors T11 and T12 are connected together at the node N6. The node N6 is connected to the input terminal Tin via the distributed constant lines L9 and L10 and the capacitor C7. The drains D11 and D12 of the first transistors T11 and T12 are connected together at the node N4. The node N4 is connected to the gates G21 and G22 of the second transistors T21 and T22 via the signal path 20.

The sources S21 and S22 of the second transistors T21 and T22 are connected together at a node N9. The source S21 of the second transistor T21 is grounded via a capacitor C11 (first capacitor), and the source S22 of the second transistor T22 is grounded via a capacitor C12 (first capacitor).

The gates G21 and G22 of the second transistors T21 and T22 are connected together at a node N5, which is connected to the signal path 20. The drains D21 and D22 of the second transistors T21 and T22 are connected together at a node N7, which is connected to the DC power supply Vd and the output terminal Tout.

The node N1 between the distributed constant lines L2 and L3 in the signal path 20 are grounded via the distributed constant line L11 and a capacitor C21. One end of the resistor R11 is connected to a node N31 between the distributed constant line L11 and the capacitor C21, and the other end thereof is connected to a node N21 between the source S21 and the capacitor C11. The node N1 is grounded via the distributed constant line L12 and a capacitor C22. One end of the resistor R12 is connected to a node N32 between the distributed constant line L12 and the capacitor C22, and the other end is connected to a node N22 between the source S22 and the capacitor C12.

The signal path 20 is common to the signal flows from the first transistors T11 and T12 to the second transistors T21 and T22. In contrast, the DC path 10 is divided into two paths from the node N7 to the node N1. A DC path 11, which is one of the two DC paths, is a path that includes the node N7, the drain D21 of the second transistor T21, the source S21 thereof, the node N9, the node N21, the resistor R11, the node N31, the distributed constant line L11 and the node N1. A DC path 22, which is the other of the two DC paths, is a path that includes the node N7, the drain D22 of the second transistor T22, the source S22 thereof, the node N22, the resistor R12, the node N32, the distributed constant line L12 and the node N1.

The DC path is further divided into two paths from the node N4 to the ground. A DC path 13, which is one of the two paths, is a path that includes the node N4, the drain D11 of the first transistor T11, the source S11 thereof, the node N8, the resistor R21 and the ground. A path 14, which is the other of the two paths, is a path that includes the node N4, the drain D12 of the first transistor T12, the source S12 thereof, the resistor R22 and the ground.

According to the second embodiment, each of the sources S21 and S22 of the second transistors T21 and T22 is connected to the drains of the first transistors T11 and T12 via one of the DC paths 11 and 12. For example, the gates G21 and G22 of the second transistors T21 and T22 are connected together at the node N5 (first connecting point). The DC path 11 is connected to the source S21 of the second transistor T21 and the node N1 (second connecting point: the node between the node N5 and the drains D11 and D12 of the first transistors T11 and T12. The DC path 12 is connected to the source S22 of the second transistor T22 and the node N1. As described above, the plurality of second transistors T21 and T22 are provided in parallel, and the DC paths 11 and 12 associated with the second transistors T21 and T22 are provided, respectively. It is thus possible to reduce the dispersion of the characteristics, as in the case of the first embodiment.

The drains D11 and D12 of the first transistors T11 and T12 are connected together at the node N4 (third connecting point). The DC path 11 is connected between the source S21 of the second transistor T21 and the node N1 (the second connecting point: a node between the node N4 and the gates G21 and G22 of the transistors T21 and T22). The DC path 12 is connected between the source S22 of the second transistor T22 and the node N1. As described above, the plurality of first transistors T11 and T12 are provided in parallel, and the DC paths 11 and 12 associated with the first transistors T11 and T12 are provided, respectively. It is thus possible to reduce the dispersion of the characteristic, as in the case of the first embodiment.

The sources S11 and S12 of the first transistors T11 and T12 are grounded via the resistors R21 and R22 (second resistors), respectively. There is a difficulty in radiation of heat generated by the transistors T11 and T12 via the capacitors C51 and C52. For example, in a case where the resistors R21 and R22 are formed by thin-film resistors formed on a substrate, the resistors R21 and R22 have a good thermal conductivity. The resistors R21 and R22 make it possible to more effectively radiate heat generated by the first transistors T11 and T12 that are grounded via the resistors R21 and R22.

The resistor R11 is provided between the distributed constant line L11 and the source S21 of the second transistor T21. Similarly, the resistor R12 is provided between the distributed constant line L12 and the source S22 of the second transistor T22. The node N31 between the resistor R11 and the distributed constant line L11 is grounded via the capacitor C21 (second capacitor). Similarly, the node N32 between the resistor R12 and the distributed constant line L12 is grounded via the capacitor C22 (second capacitor). The distributed constant lines L11, L12, L2 and L3 and the capacitors C21 and C22 function to match the impedances of the first transistors T11 and T12 with those of the second transistors T21 and T22.

For example, the impedance matching may be achieved so that the amplifier circuit 101 has a broader band. For example, the impedance matching is performed so that an impedance Z1 obtained by viewing the transistors T11 and T12 from the node N5 at a first frequency that is the upper limit of the band of the amplifier circuit 101 is most closely matched with an impedance Z2 obtained by viewing the transistors T21 and T22. The impedance matching between the impedances Z1 and Z2 is set so that the difference between the impedances Z1 and Z2 becomes larger as the frequency becomes lower from the first frequency. The difference between the impedances Z1 and Z2 is adjusted so as to compensate for the gains of the transistors T11, T12, T21 and T22 that becomes larger as the frequency becomes lower from the first frequency. It is thus possible to realize the broadband amplifier circuit.

The impedances of the capacitors C21 and C22 at the lower limit of the band of the amplifier circuit 101 are set approximately equal to or larger than the impedances of the resistors R11 and R12. Thus, the signal having the frequency corresponding to the lower limit flows to the ground via the resistors R11 and R12 in addition to the capacitors C21 and C22. The signals passing through the resistors R11 and R12 are attenuated. It is thus possible to suppress oscillation at the lower limit of the band of the amplifier circuit 101.

Third Embodiment

Figure 4:
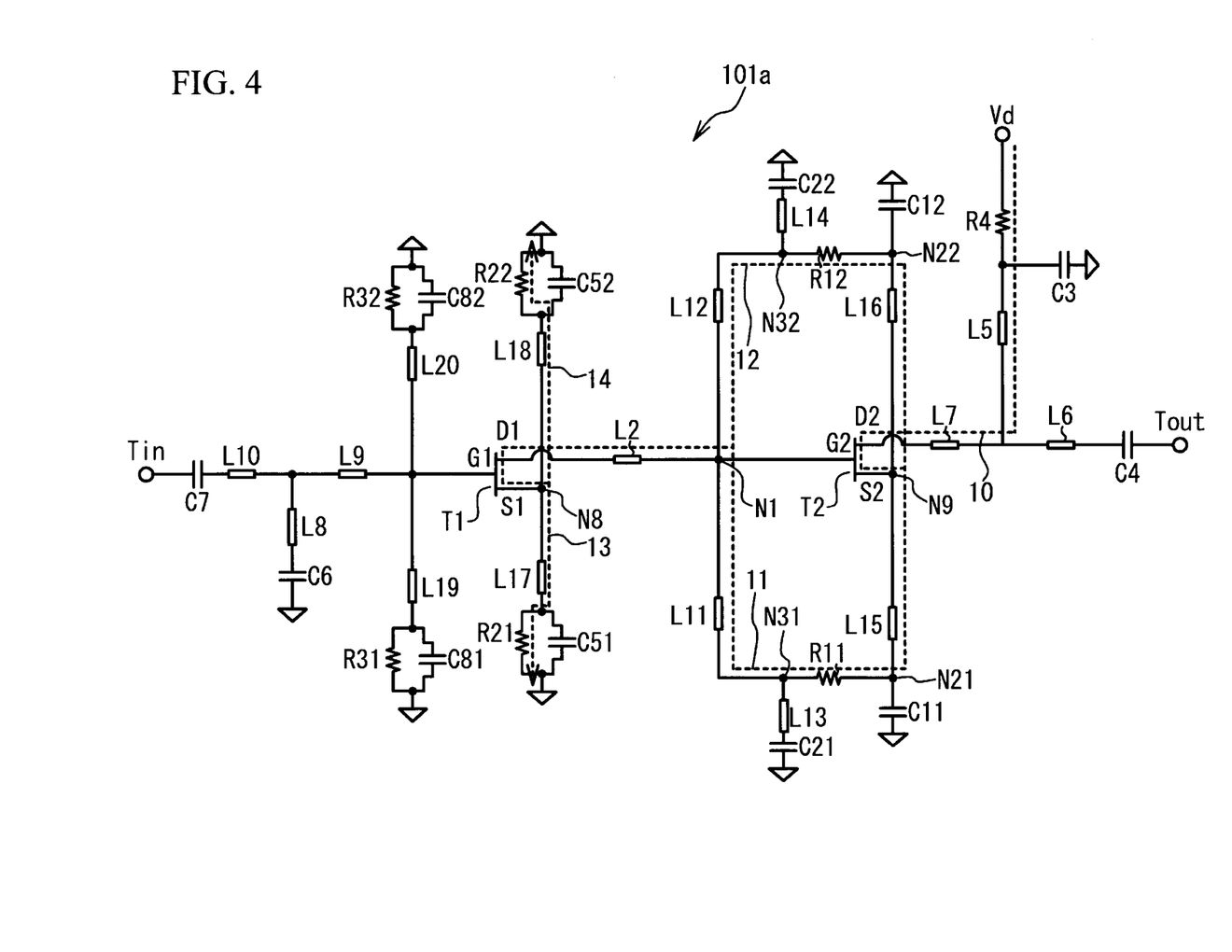
FIG. 4 is a circuit diagram of an amplifier circuit in accordance with a third embodiment.

A third embodiment is an amplifier circuit whose operation is simulated. FIG. 4 is a circuit diagram of an amplifier circuit in accordance with the third embodiment. Referring to FIG. 4, an amplifier circuit 101a has only one first transistor T1 and only one second transistor T2. This arrangement is different from that of the second embodiment illustrated in FIG. 3. The resistor R3 illustrated in FIG. 3 is not provided in the third embodiment. The gate G1 of the first transistor T1 is grounded via two paths. In one of the two paths, the gate G1 is grounded via a distributed constant line L19 and a parallel circuit connected in series therewith and composed of a capacitor C81 and a resistor R31. In the other path, the gate G1 is grounded via a distributed constant line L20 and a parallel circuit connected in series therewith and composed of a capacitor C82 and a resistor R32. A distributed constant line L17 is connected between the source S1 of the first transistor T1 and the parallel circuit composed of the resistor R21 and the capacitor C51. A distributed constant line L18 is connected between the drain D1 of the first transistor T1 and the parallel circuit composed of the resistor R22 and the capacitor C52. A distributed constant line L13 is connected between the node N31 and the capacitor C21, and a distributed constant line L14 is connected between the node N32 and the capacitor C22. A distributed constant line L15 is connected between the source S2 of the second transistor T2 and the node N21, and a distributed constant line L16 is connected between the source S2 and the node N22. An internal resistor R4 is connected in the DC power supply Vd. The other structures of the third embodiment are the same as those of the second embodiment, and a description thereof is omitted here.

Figure 5:
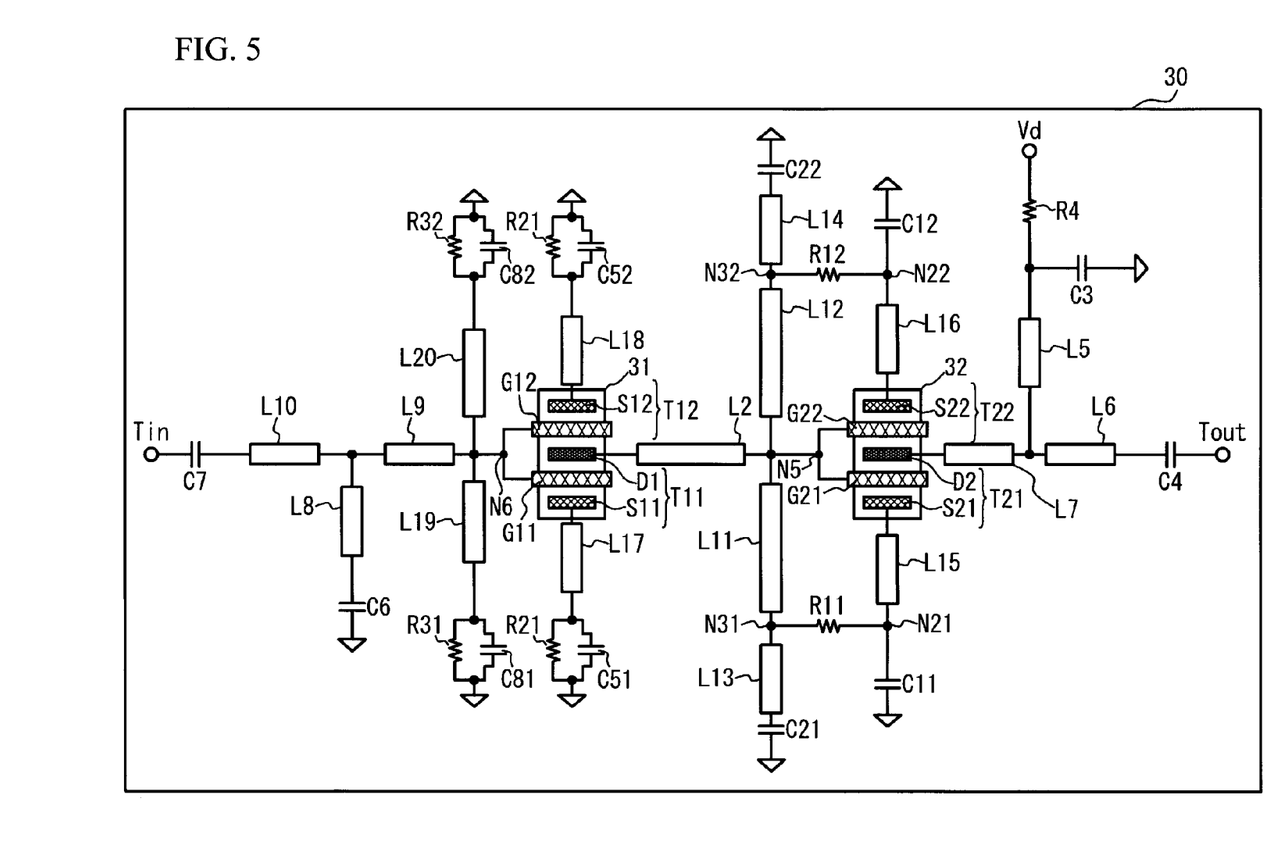
FIG. 5 is a schematic plan view of an MMIC in which the amplifier circuit of the third embodiment is formed on a semiconductor substrate.

FIG. 5 is a schematic plan view of an MMIC (Monolithic Microwave Integrated Circuit) in which the amplifier circuit of the third embodiment is formed on a semiconductor substrate 30. Capacitors in FIG. 5 are MIM (Metal Insulator Metal) capacitors formed on the semiconductor substrate 30. Each MIM capacitor is formed by a lower electrode, a dielectric film formed on the lower electrode, and an upper electrode formed on the dielectric film. The lower and upper electrodes may be made of a metal such as gold. The lower electrode be is formed on the semiconductor substrate 30 or on an insulation film provided on the semiconductor substrate 30. The dielectric film may be made of silicon nitride. Resistors may be thin-film resistors formed on the semiconductor substrate 30 or on an insulation film formed on the semiconductor substrate 30. Distributed constant lines may be formed by a metal film such as gold, which is provided on the semiconductor substrate 30 or an insulation film on the semiconductor substrate 30, and may be a microstrip line, for example.

The first transistor T1 and the second transistor T2 are formed in the semiconductor substrate 30. The first transistor T1 has an active region 31, in which arranged are the source S11, the gate G11, the drain D1, the gate G12 and the source S12 in this order. The first transistor T1 may be a multi-finger FET, and is composed of two first transistors T11 and T12 in which the drain D1 is common thereto. The second transistor T2 has an active region 32, in which arranged are the source S21, the gate 21, the drain D2, the gate G22 and the source 22 in this order. The second transistor T2 may be a multi-finger FET composed of two second transistors T21 and T22 in which the drain D2 is common thereto.

Table 1 shows parameter values used in a simulation of the amplifier circuit of the third embodiment. In Table 1, the distributed constant lines have a width of 10 μm, an effective dielectric constant of 1.5, and a characteristic impedance of 50Ω. The unit of capacitors is pF, and the unit of resistors is Ω, and the unit of power supply voltage Vd is V. The first transistors T11 and T12 and the second transistors T21 and T22 are GaAs/AlGaAs-based HEMTs (High Electron Mobility Transistors). The gate widths of the transistors T11, T12, T21 and T22 are 80 μm, which may be the total of two gate widths each having 40 μm. That is, each of the transistors T11, T12, T21 and T22 has two gate fingers each of which is 40 μm wide.

TABLE 1

| Line μm | L2 | L5 | L6 | L7 | L8 | L9 | L10 | | | |
|---|---|---|---|---|---|---|---|---|---|---|
| | 100 | 70 | 100 | 70 | 20 | 60 | 50 | | | |

| Line μm | L11 | L12 | L13 | L14 | L15 | L16 | L17 | L18 | L19 | L20 |
|---|---|---|---|---|---|---|---|---|---|---|
| | 150 | 150 | 30 | 30 | 30 | 30 | 70 | 70 | 100 | 100 |

| Capacitor pF | C11 | C12 | C21 | C22 | C3 | C4 | C51 | C52 | C6 | C7 | C81 | C82 |
|---|---|---|---|---|---|---|---|---|---|---|---|---|
| | 0.8 | 0.8 | 0.3 | 0.3 | 3.0 | 0.3 | 0.8 | 0.8 | 0.08 | 0.3 | 0.9 | 0.9 |

| Resistor Ω | R11 | R12 | R21 | R22 | R31 | R32 | R4 |
|---|---|---|---|---|---|---|---|
| | 14 | 14 | 14 | 14 | 100 | 100 | 20 |

| Power supply V | Vd |
|---|---|
| | 5 |

Figure 6A:
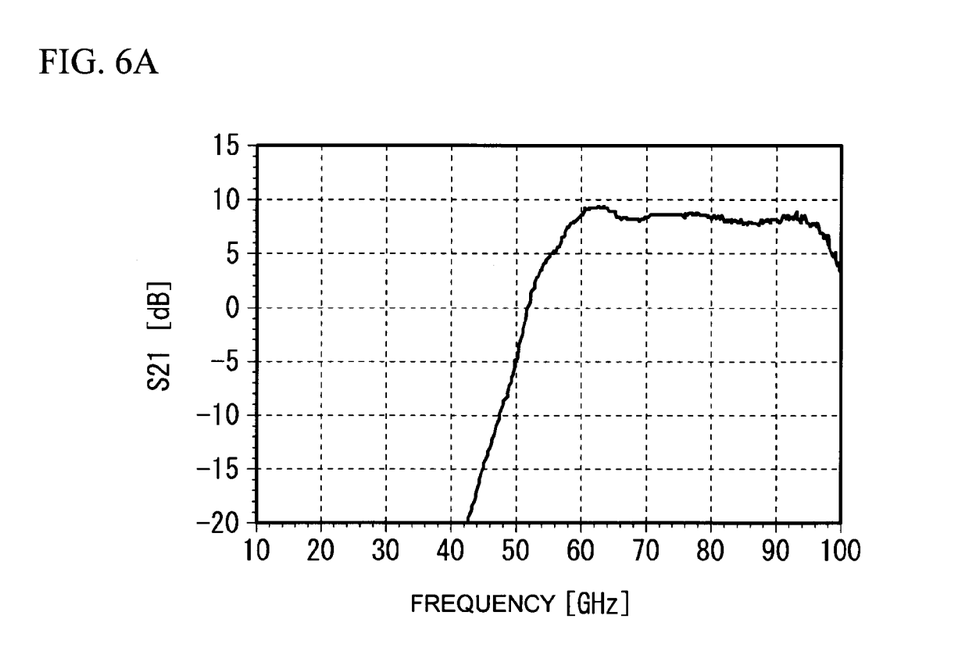
FIG. 6A is a diagram of S21 associated with the frequency of the amplifier circuit of the third embodiment.
Figure 6B:
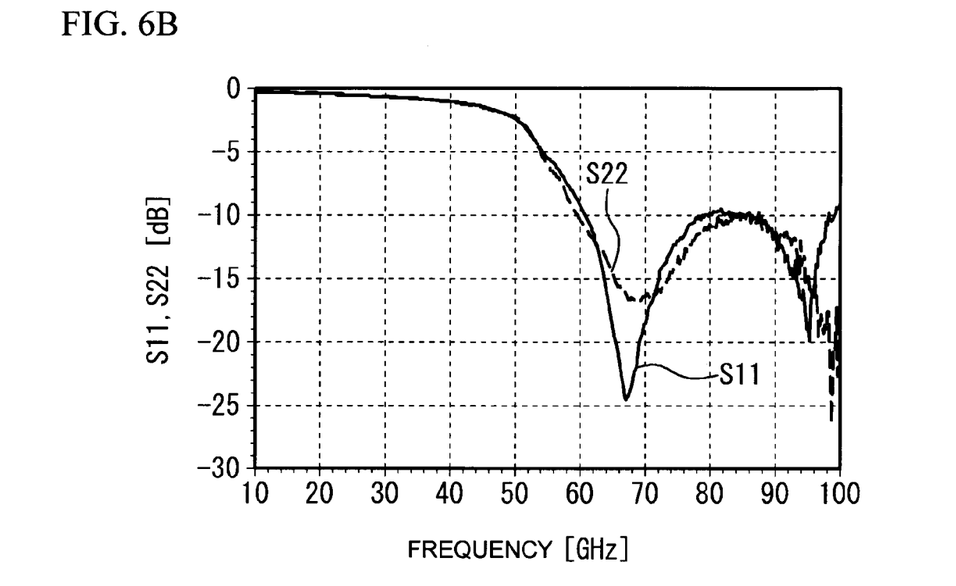
FIG. 6B is a diagram of S11 and S22 associated with the frequency.

FIG. 6A illustrates S21 associated with the frequency of the amplifier circuit of the third embodiment, and FIG. 6B illustrates S11 and S22 associated with the frequency thereof. Referring to FIG. 6A, the gain is almost constant in the range of about 60 GHz to 96 GHz and is approximately 8 dB. Within the above frequency, S11 and S22 are suppressed to −10 dB or lower. The mutually independent DC paths 11 and 12 employed in the third embodiment are operationally closer to distributed constant lines. It is thus possible to realize a broader amplifier circuit.

The distributed constant lines L11 and L12 may have a substantially equal reactance component. The resistors R11 and R12 may have a substantially equal resistance. With this setting, the DC paths 11 and 12 are balanced better and a broader band may be achieved. The two-dimensional arrangement of the DC paths 11 and 12 on the semiconductor substrate 30 may be symmetrical about the second transistor T2. The symmetrical arrangement may realize a broader band.

The distributed constant lines L13 and L14 may have a substantially equal reactance component, and the capacitors C21 and C22 may have a substantially equal capacitance. With this setting, the circuit has a better balance in high-frequency operation and a broader band may be realized. Further, the two-dimensional arrangement of a group of L13, C21, L15 and C11 and a group of L14, C22, L16 and C12 about the second transistor T2 will bring about a better balance and realize a much broader band.

The resistors R21 and R22 may have a substantially equal resistance. The distributed constant lines L17 and L18 may have a substantially equal reactance component. The capacitors C51 and C52 may have a substantially equal capacitance. With this setting, the DC paths 13 and 14 may be balanced better and a broader band may be realized. The distributed constant lines L19 and L20 may have a substantially equal reactance component. The capacitors C81 and C82 may have a substantially equal capacitance. The resistors R31 and R32 may have a substantially equal resistance. With this setting, the circuit has a better balance in high-frequency operation and a broader band may be realized. Further, the two-dimensional arrangement of a group of L17, L19, C51, C81, R21 and R31 and a group of L18, L20, C52, C82, R22 and R32 about the first transistor T1 will bring about a better balance and realize a broader band.

Further, as illustrated in FIG. 5, the first transistor T1 and the second transistor T2 are symmetrically arranged, so that the DC paths 13 and 14 can be better balanced and a broader band can be realized. The opposite sides of the transistor T1 are the sources thereof, and the opposite sides of the transistor T2 are also the sources thereof. It is thus possible to arrange the DC paths 13 and 14 symmetrically and realize a broader band.

The first transistor may be a single transistor like the first embodiment, or a plurality of first transistors may be provided like the second embodiment. The second transistor may be a single transistor like the first embodiment, or a plurality of second transistors may be provided like the second embodiment.

The first and second transistors may be FETs each having a single gate finger or may be FETS each having a plurality of gate fingers.

The first transistor T1 and the second transistor T2 are not limited to FETs but may be bipolar transistors. In this case, the emit and the collector correspond to the first and second terminals, respectively, and the base corresponds to the control terminal. The distributed constant lines may be inductance elements such as short stubs.

The present invention is not limited to the specifically described embodiments, but other embodiments and variations may be made without departing from the scope of the claimed invention.

What is claimed is:

1. An electronic circuit comprising:
   a first transistor having a control terminal, a first terminal, and a second terminal;
   a second transistor having a control terminal connected to the second terminal of the first transistor, a first terminal, and a second terminal connected to a DC power supply;
   a plurality of DC paths that are mutually independent of each other and supply DC currents from the first terminal of the second transistor to the second terminal of the first transistor; and
   distributed constant lines connected in series with the plurality of DC paths.

2. The electronic circuit according to claim 1, wherein further comprising first resistors connected in series with the distributed constant lines in the plurality of DC paths.

3. The electronic circuit according to claim 1, wherein the electronic circuit includes a plurality of second transistors connected in parallel, and the first terminal of each of the plurality of the second transistors is connected to the second terminal of the first transistor via a one of the plurality of DC paths.

4. The electronic circuit according to claim 1, wherein the electronic circuit includes a plurality of first transistors connected in parallel.

5. The electronic circuit according to claim 4, further comprising a plurality of second resistors connected between the first terminal of each of the plurality of the first transistors and ground.

6. The electronic circuit according to claim 2, wherein each of the first resistors is connected between a corresponding one of the distributed constant lines and the first terminal of the second transistor, and connecting points between the first resistors and the plurality of distributed constant lines are grounded via capacitors.

7. The electronic circuit according to claim 1, wherein the distributed constant lines have a substantially equal reactance component.

8. The electronic circuit according to claim 2, wherein the first resistors have a substantially equal resistance.

9. The electronic circuit according to claim 3, further comprising first resistors connected in series with the distributed constant lines in the plurality of DC paths and the first terminals of the second transistors, and connecting points between the first resistors and the distributed constant lines are grounded via capacitors.

10. An electronic circuit comprising:
- a first transistor having a control terminal, a first terminal, and a second terminal;
- a second transistor having a control terminal connected to the second terminal of the first transistor, a first terminal, and a second terminal connected to a DC power supply;
- a first node connected with the second terminal of the first transistor;
- a second node connected with the first terminal of the second transistor; and
- a plurality of DC paths that are mutually independent of each other and are connected between the first node and the second node.

* * * * *